(12) United States Patent
Kim et al.

(10) Patent No.: US 10,197,617 B2
(45) Date of Patent: Feb. 5, 2019

(54) PROBE CARD LOADING APPARATUS AND PROBE CARD MANAGING SYSTEM INCLUDING THE SAME

(71) Applicant: Samsung Electronics Co., Ltd., Suwon-si, Gyeonggi-do (KR)

(72) Inventors: Youngin Kim, Hwaseong-si (KR); Jongsam Kim, Suwon-si (KR); Byung-Soo Park, Hwaseong-si (KR); Sookil Park, Osan-si (KR); Byungkook Yoo, Suwon-si (KR); Younghyen Lee, Osan-si (KR); Seong Sil Jeong, Seoul (KR); Wooseong Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 302 days.

(21) Appl. No.: 14/955,432

(22) Filed: Dec. 1, 2015

(65) Prior Publication Data
US 2016/0185535 A1 Jun. 30, 2016

(30) Foreign Application Priority Data

Dec. 24, 2014 (KR) .................. 10-2014-0188108

(51) Int. Cl.
*G01R 31/26* (2014.01)
*G01R 31/28* (2006.01)

(52) U.S. Cl.
CPC ..... *G01R 31/2601* (2013.01); *G01R 31/2889* (2013.01); *G01R 31/2893* (2013.01)

(58) Field of Classification Search
CPC ............ G01R 31/2601; G01R 31/2889; G01R 31/2893
See application file for complete search history.

(56) References Cited

U.S. PATENT DOCUMENTS

| | | | |
|---|---|---|---|
| 5,375,710 A * | 12/1994 | Hayakawa | H05K 7/1023 206/724 |
| 7,385,386 B2 | 6/2008 | Amemiya et al. | |
| 7,887,277 B2 | 2/2011 | Campbell et al. | |
| 8,040,147 B2 | 10/2011 | Nozaki et al. | |
| 8,267,633 B2 | 9/2012 | Obikane | |
| 8,490,802 B2 | 7/2013 | Honda et al. | |
| 2002/0037657 A1* | 3/2002 | Hirai | H01L 24/72 439/82 |
| 2005/0170689 A1* | 8/2005 | Hoppe | G01R 1/0408 439/517 |

(Continued)

FOREIGN PATENT DOCUMENTS

| | | |
|---|---|---|
| JP | 2004-170267 A | 6/2004 |
| JP | 5517344 B2 | 3/2011 |

(Continued)

*Primary Examiner* — Jermele M Hollington
*Assistant Examiner* — Alvaro Fortich
(74) *Attorney, Agent, or Firm* — Harness, Dickey & Pierce, P.L.C.

(57) ABSTRACT

A loading apparatus is provided which includes a package jig, a transfer unit, and a load port. The package jig is fixed to a package. The transfer unit includes a hand for holding the package jig and transferring the package. The package transferred by the transfer unit is loaded on the load port. The load port and the hand include first alignment pins and first alignment sockets for aligning the package to the load port.

15 Claims, 18 Drawing Sheets

(56) References Cited

U.S. PATENT DOCUMENTS

| | | | | |
|---|---|---|---|---|
| 2007/0126441 A1* | 6/2007 | Mochizuki | ......... | G01R 31/2887 |
| | | | | 324/750.22 |
| 2011/0215826 A1* | 9/2011 | Hwang | ................. | G01R 31/26 |
| | | | | 324/762.02 |
| 2013/0056872 A1* | 3/2013 | Liu | ........................ | H01L 23/48 |
| | | | | 257/738 |
| 2014/0070828 A1 | 3/2014 | Andberg et al. | | |
| 2015/0285838 A1* | 10/2015 | Mori | ........................ | G01R 1/04 |
| | | | | 324/756.03 |

FOREIGN PATENT DOCUMENTS

| | | |
|---|---|---|
| JP | 5035415 B2 | 9/2012 |
| JP | 2014-103358 A | 6/2014 |
| KR | 10-0617273 B1 | 8/2006 |
| KR | 10-0833285 B1 | 5/2008 |
| KR | 10-1019534 B1 | 3/2011 |
| KR | 10-1019535 B1 | 3/2011 |
| KR | 10-1279318 B1 | 6/2013 |

* cited by examiner

PROBE CARD LOADING APPARATUS AND PROBE CARD MANAGING SYSTEM INCLUDING THE SAME

CROSS-REFERENCE TO RELATED APPLICATIONS

A claim for priority under 35 U.S.C. § 119 is made to Korean Patent Application No. 10-2014-0188108 filed Dec. 24, 2014, in the Korean Intellectual Property Office, the entire contents of which are hereby incorporated by reference.

BACKGROUND

A semiconductor device may be fabricated using a plurality of unit processes. Among the unit processes, a test process is a process for determining the reliability of the semiconductor device. A tester outputs or receives an electric signal to or from the semiconductor device using a probe card. The probe card may be connected with a semiconductor device at a wafer level. In general, managing and loading of the probe card may be performed manually by an operator.

SUMMARY

In at least one example embodiment of the inventive concepts, a probe card loading apparatus capable of aligning a probe card to a load port is provided.

In some example embodiments of the inventive concepts a probe card loading apparatus capable of automatizing logistics movement of a probe card and a probe card managing system including the same is provided.

At least one example embodiment provides a loading apparatus which includes a package jig, a transfer unit, and a load port. The package jig may be fixed to a package. The transfer unit may include a hand for holding the package jig and transfers the package. The package transferred by the transfer unit may be loaded on the load port. The load port and the hand may include first alignment pins and first alignment sockets for aligning the package to the load port.

At least one example embodiment provides a probe card managing system which includes a stocker, a tester, and a card loading apparatus. The stocker may keep a probe card, and the tester may test a substrate connected with the probe card. The card loading apparatus may transfer the probe card to the stocker and to load the probe card on the substrate. The card loading apparatus may include a probe card jig fixed to a probe card; a transfer unit including a hand for holding the probe card jig and configured to transfer the probe card; and a load port on which the probe card transferred by the transfer unit is loaded. The load port and the hand comprise first alignment pins and first alignment sockets for aligning the probe card to the load port, respectively.

In at least one example embodiment, a probe card loading apparatus is provided. The probe card loading apparatus includes a stage unit having a load port and a card transfer unit including a hand loading a probe card on the load port. The load port and the hand include first alignment pins and first alignment sockets for aligning the probe card to the load port, respectively.

In another example embodiment, a manual carrier transfer apparatus is provided. The manual carrier transfer apparatus includes a card carrier including a carrier housing. The carrier housing includes an opening therein and a carrier rack. The carrier rack has a generally U-shaped recess therein and includes a support block, a guide pin, and a card detector. The carrier rack is configured to receive a probe card. The manual carrier transfer apparatus also includes a conveyor configured to transfer the card carrier.

In some example embodiments, the carrier housing is hexahedral in shape. The guide pin is adjacent the support block. The U-shaped recess is configured to receive a card case including a card alignment hole. The guide pin and the card alignment hole align the card case and the carrier rack.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

FIG. 14 is a diagram schematically illustrating a test apparatus of FIG. 1 and.

DETAILED DESCRIPTION

Figure 1:
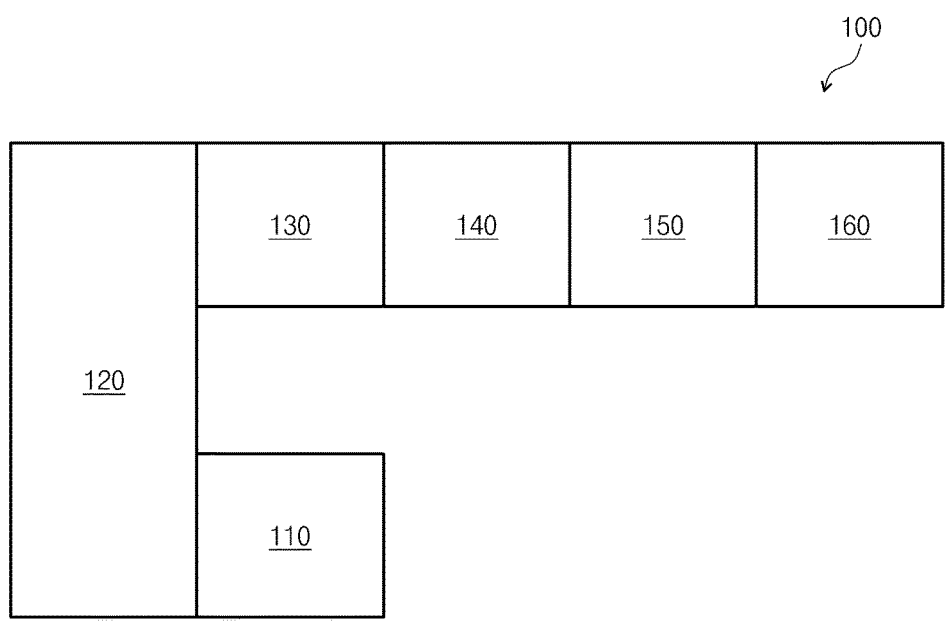
FIG. 1 is a diagram schematically illustrating a probe card managing system according to example embodiments.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
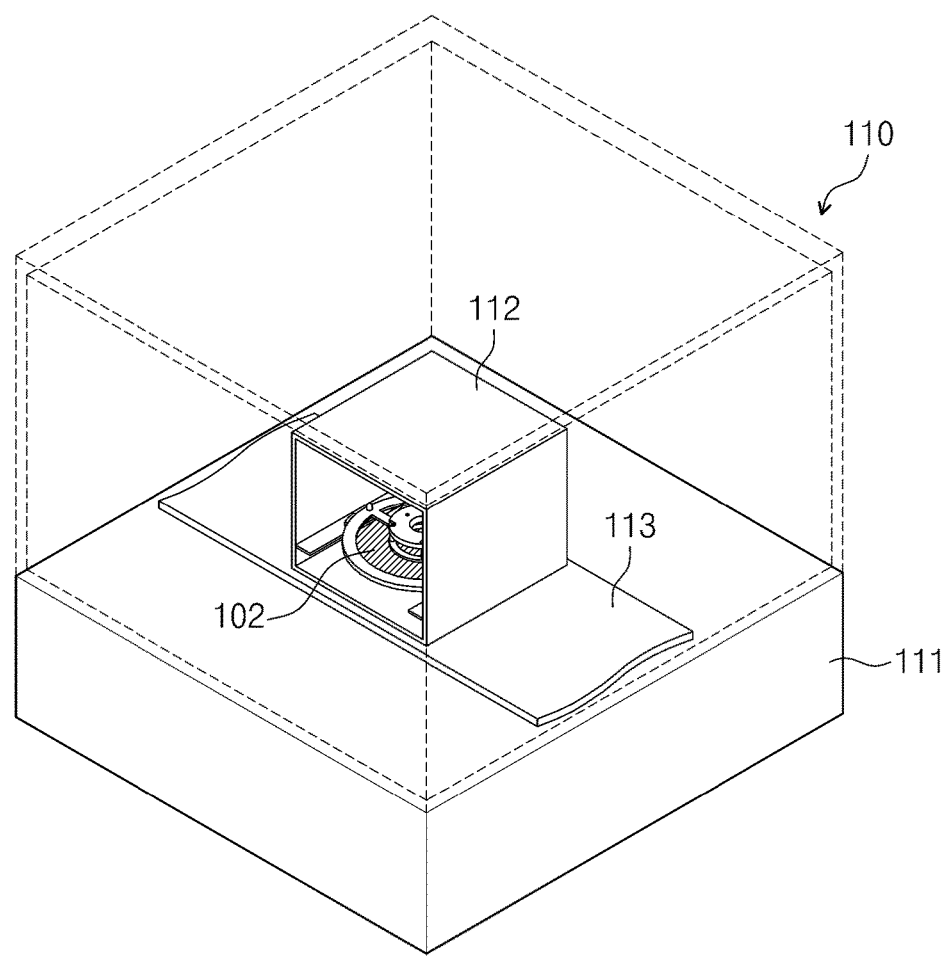
FIG. 2 is a diagram schematically illustrating a manual carrier transfer apparatus and a card carrier.

FIG. 1 is a diagram schematically illustrating a probe card managing system according to some example embodiments. FIG. 2 is a diagram schematically illustrating a manual carrier transfer apparatus 110 and a card carrier 112.

Referring to FIGS. 1 and 2, in some example embodiments, the probe card managing system 100 may be a semiconductor device manufacturing apparatus. The probe card managing system 100 includes a manual carrier transfer apparatus 110, a jeep tower 120, an automatic carrier transfer apparatus 130, a stocker 140, a probe card loading apparatus 150, and a test apparatus 160. The manual carrier transfer apparatus 110 transfers the card carrier 112 on which a probe card 102 is loaded. In some example embodiments, the manual carrier transfer apparatus 110 may include a man machine interface conveyer (not shown). The jeep tower 120 transfers the probe card 102 between the manual carrier transfer apparatus 110 and the automatic carrier transfer apparatus 130. The jeep tower 120 may elevate the card carrier 112. The automatic carrier transfer apparatus 130 transfers the card carrier 112 between the jeep tower 120 and the stocker 140. The stocker 140 receives the probe card 102. The probe card loading apparatus 150 is positioned between the stocker 140 and the test apparatus 160. The test apparatus 160 provides a test signal to the probe card 102 on the probe card loading apparatus 150 to perform a test process.

The manual carrier transfer apparatus 110 has a worktable 111 and a conveyer 113. The card carrier 112 is provided on the worktable 111. The conveyer 113 transfers the card carrier 112. In contrast, the card carrier 112 may be transferred by a transferring vehicle (not shown) or an overhead hoist transfer (not shown).

Figure 3:
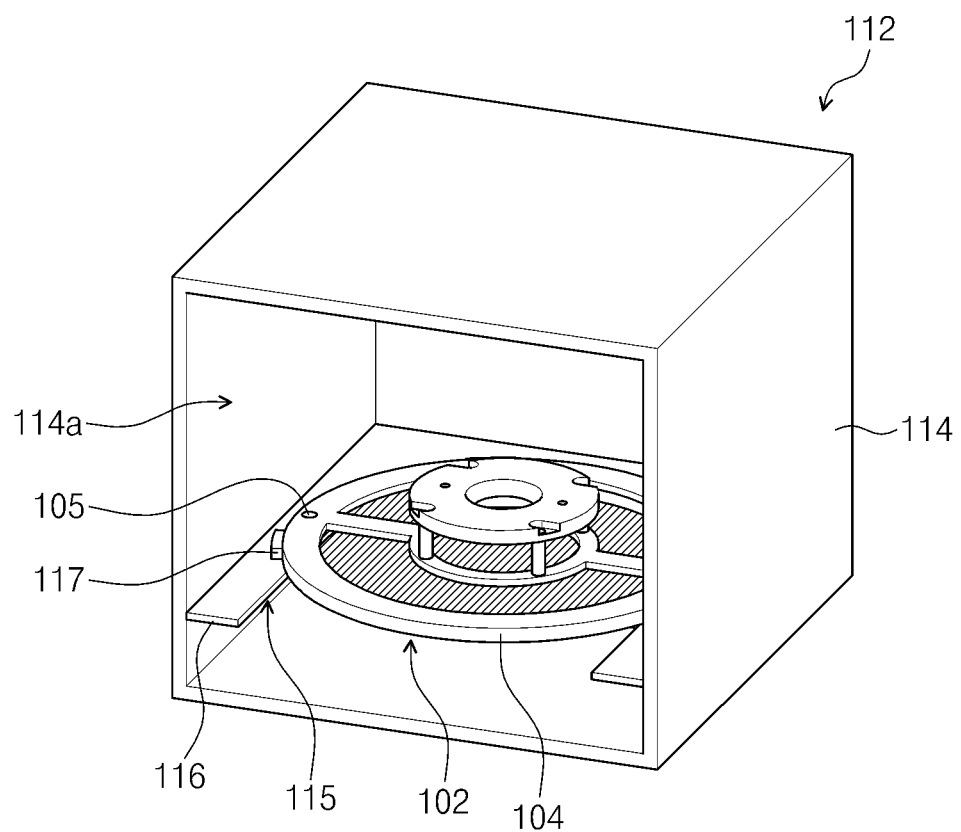
FIG. 3 is a diagram schematically illustrating a card carrier of FIG. 2.
Figure 4:
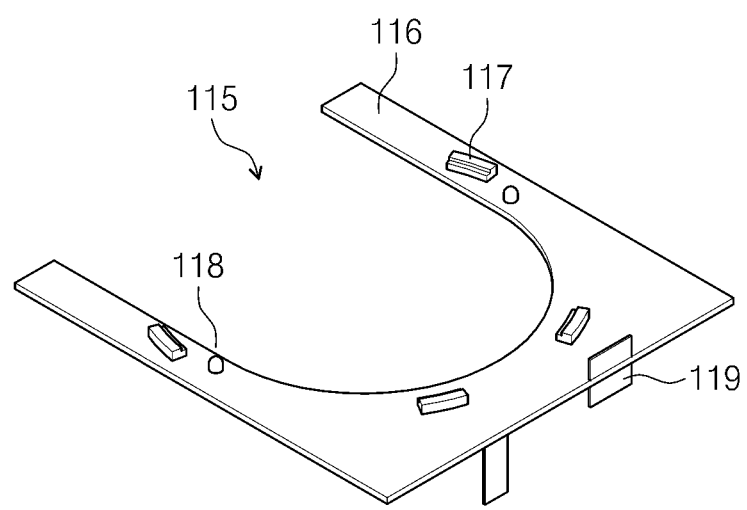
FIG. 4 is a diagram schematically illustrating a carrier rack.

FIG. 3 is a diagram schematically illustrating the card carrier 112. FIG. 4 is a diagram schematically illustrating a carrier rack.

Referring to FIG. 3, the card carrier 112 includes a carrier housing 114 and a carrier rack 116. The carrier housing 114 has a hexahedral shape. The carrier housing 114 has an opening 114a. The carrier rack 116 is positioned in the carrier housing 114. The carrier rack 116 receives a probe card 102. The probe card 102 is provided in the carrier housing 114 via the opening 114a.

Referring to FIGS. 3 and 4, the carrier rack 116 may include a generally U-shaped open hole 115 or recess, support blocks 117, guide pins 118, and a card detector 119. The open hole 115 is formed at a central portion of the carrier rack 116. The open hole 115 may prevent a bottom of the probe card 102 from being damaged. The open hole 115 may be formed in a direction of the opening 114a. The support blocks 117 are positioned along a periphery of the open hole 115. The support blocks 117 support the probe card 102. For example, a card case 104 may be provided on the support blocks 117. The guide pins 118 are positioned adjacent to the support blocks 117. The guide pins 118 are provided in card alignment holes 105 of the card case 104. The guide pins 118 and the card alignment holes 105 may align the card case 104 and the carrier rack 116. In contrast, the guide pins 118 and the card alignment holes 105 may fix the probe card 102 on the carrier rack 116. The card detector 119 detects whether the probe card 102 is placed on the carrier rack 116. In some example embodiments, the card detector 119 may include mirrors for reflecting laser beams from an external sensor (not shown) to the probe card 102.

Figure 5:
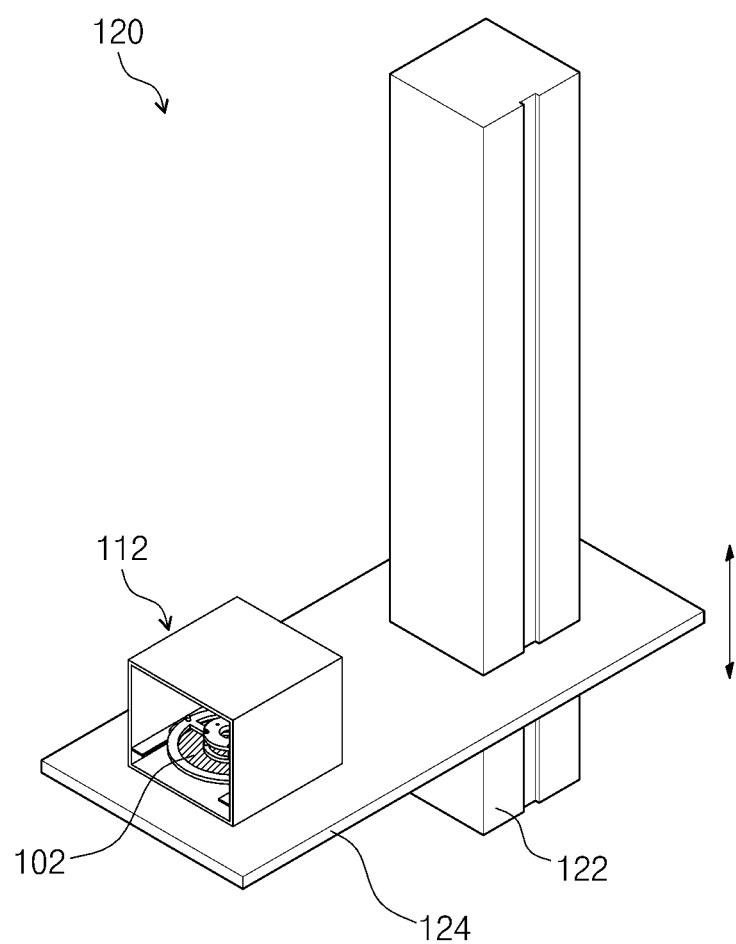
FIG. 5 is a diagram schematically illustrating a jeep tower of FIG. 1.

FIG. 5 is a diagram schematically illustrating a jeep tower 120 of FIG. 1.

Referring to FIG. 5, a jeep tower 120 includes an elevator 124. The elevator 124 goes up and down along a shift shaft 122. The card carrier 112 is loaded on the elevator 124. The jeep tower 120 may transfer the card carrier 112 between a main line zone (not shown) and a sub line zone (not shown) of semiconductor production line. The main line zone is a zone where a unit process of a semiconductor device is performed. The sub line zone is a zone where substrates, materials, or parts to be provided to the main line zone stand by. A manual carrier transfer apparatus 110 is mainly in the sub line zone. An automatic carrier transfer apparatus 130 (shown in FIG. 6) is in the main line zone. In general, the main line zone and the sub line zone may be at different layers of a semiconductor production line building. The jeep tower 120 may connect the main line zone and the sub line zone.

Figure 6:
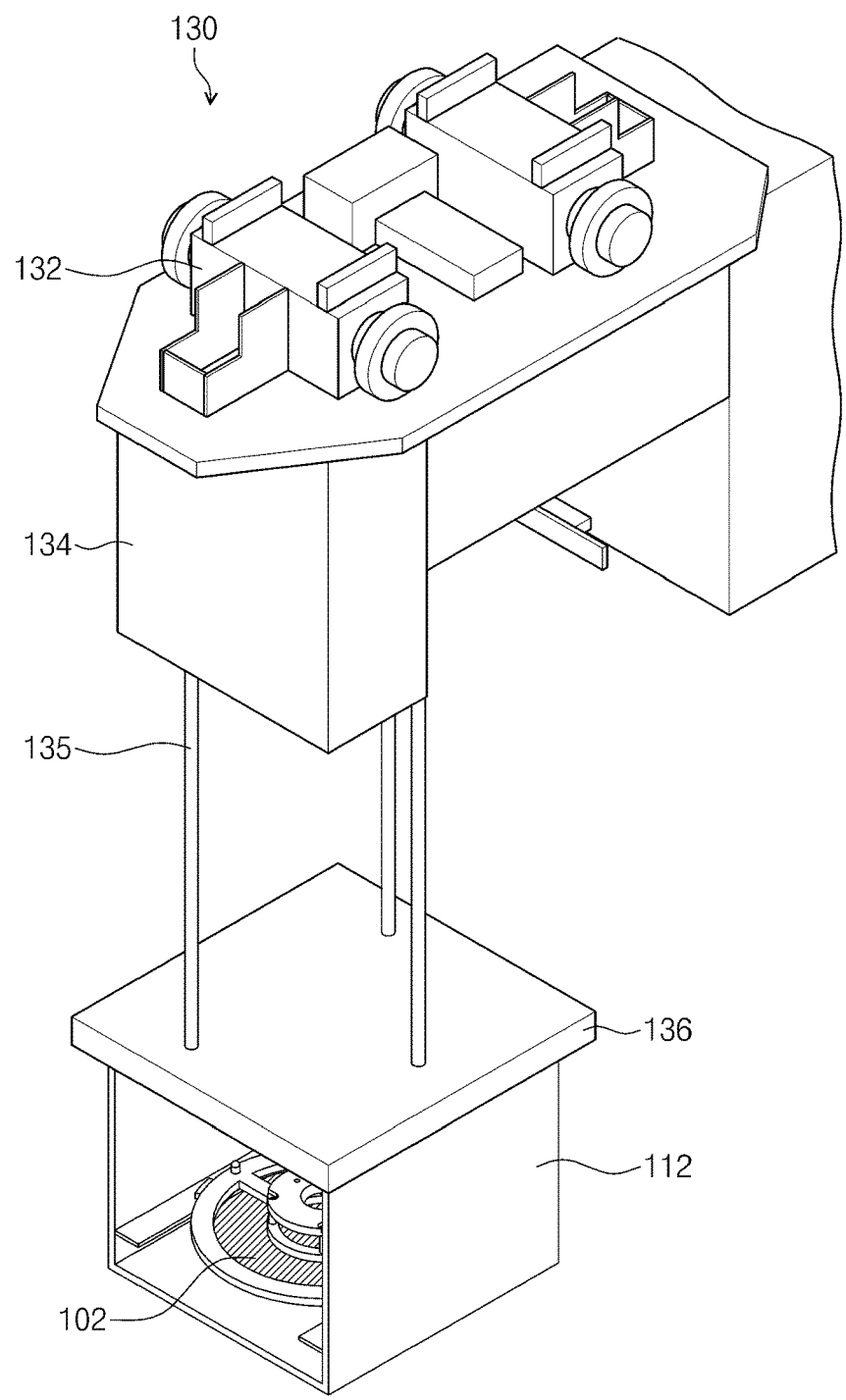
FIG. 6 is a diagram schematically illustrating an automatic carrier transfer apparatus of FIG. 1.

FIG. 6 is a diagram schematically illustrating an automatic carrier transfer apparatus 130 of FIG. 1.

Referring to FIG. 6, an automatic carrier transfer apparatus 130 may be a carrier transfer unit. In some example embodiments, the automatic carrier transfer apparatus 130 includes a first driving portion 132, a first hoisting portion 134, and a first hand portion 136. The first driving portion 132 moves the first hoisting portion 134 and the first hand portion 136. The first driving portion 132 shifts along a guide rail (not shown) between a jeep tower 120 and a stocker 140. The first hoisting portion 134 is under the first driving portion 132. The first hoisting portion 134 lifts the first hand portion 136 using first lines 135. The first hand portion 136 holds the card carrier 112. Accordingly, the automatic carrier transfer apparatus 130 transfers the card carrier 112.

Figure 7:
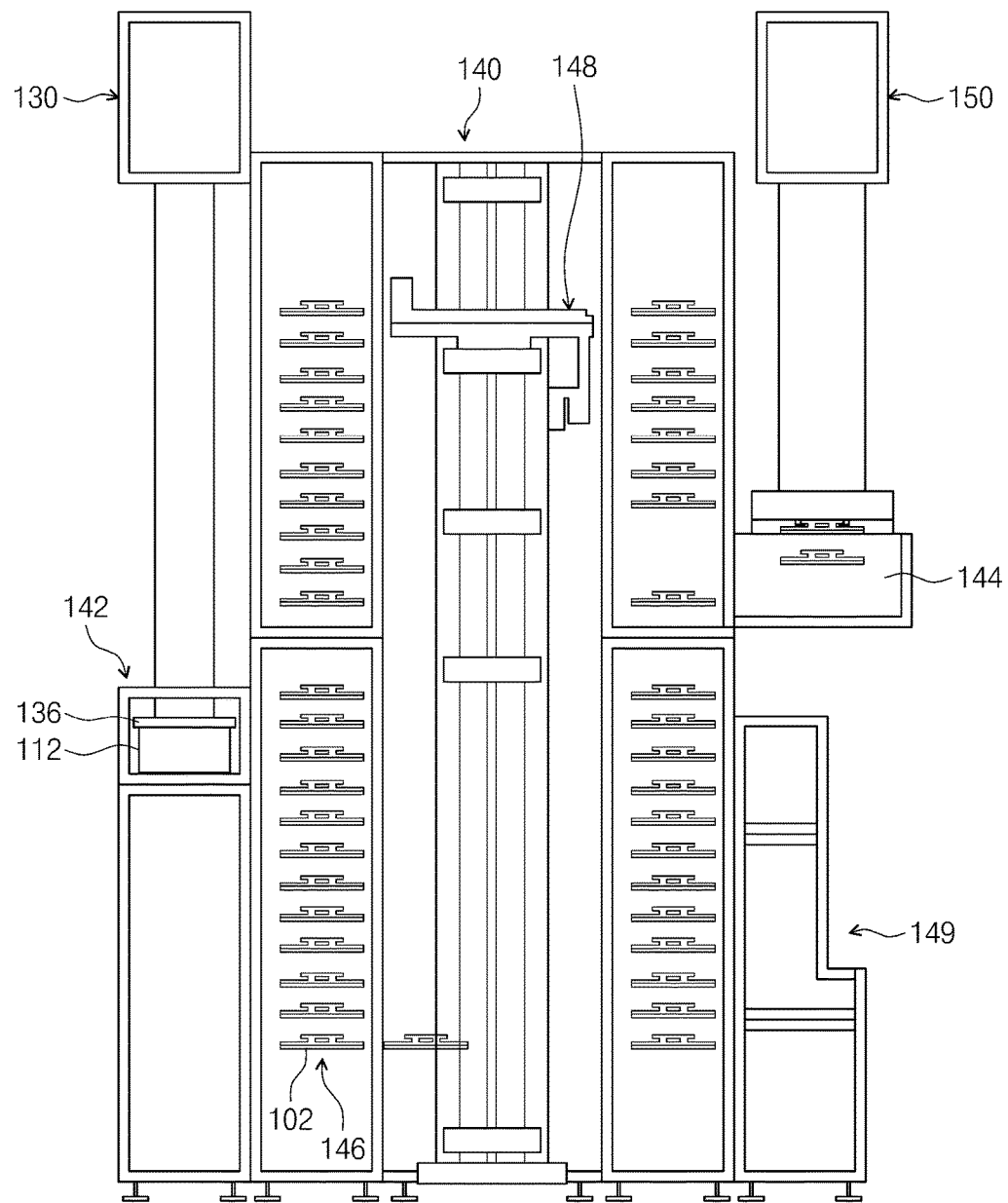
FIG. 7 is a diagram schematically illustrating a stocker of FIG. 1.

FIG. 7 is a diagram schematically illustrating a stocker 140.

Referring to FIG. 7, a stocker 140 includes a carrier opener 142, a transfer port 144, racks 146, an elevator 148, and a manual port 149. The carrier opener 142 opens the card carrier 112. The carrier opener 142 is at one side of the stocker 140. A first hand portion 136 of the automatic carrier transfer apparatus 130 provides the card carrier 112 in the carrier opener 142. Probe cards 102 in the card carrier 112 are stored in the stocker 140. The transfer port 144 is at the other side of the stocker 140. The transfer port 144 provides the probe cards 102 to a card loading apparatus 150. The card loading apparatus 150 independently transfers the probe cards 102. The racks 146 are in the stocker 140. The racks 146 receive the probe cards 102 in the stocker 140. The elevator 148 lifts the probe cards 102 in the stocker 140. The manual port 149 is under the transfer port 144. The manual port 149 is a port for putting and discharging the probe cards 102 in or from the stocker 140 in emergency.

Figure 8:
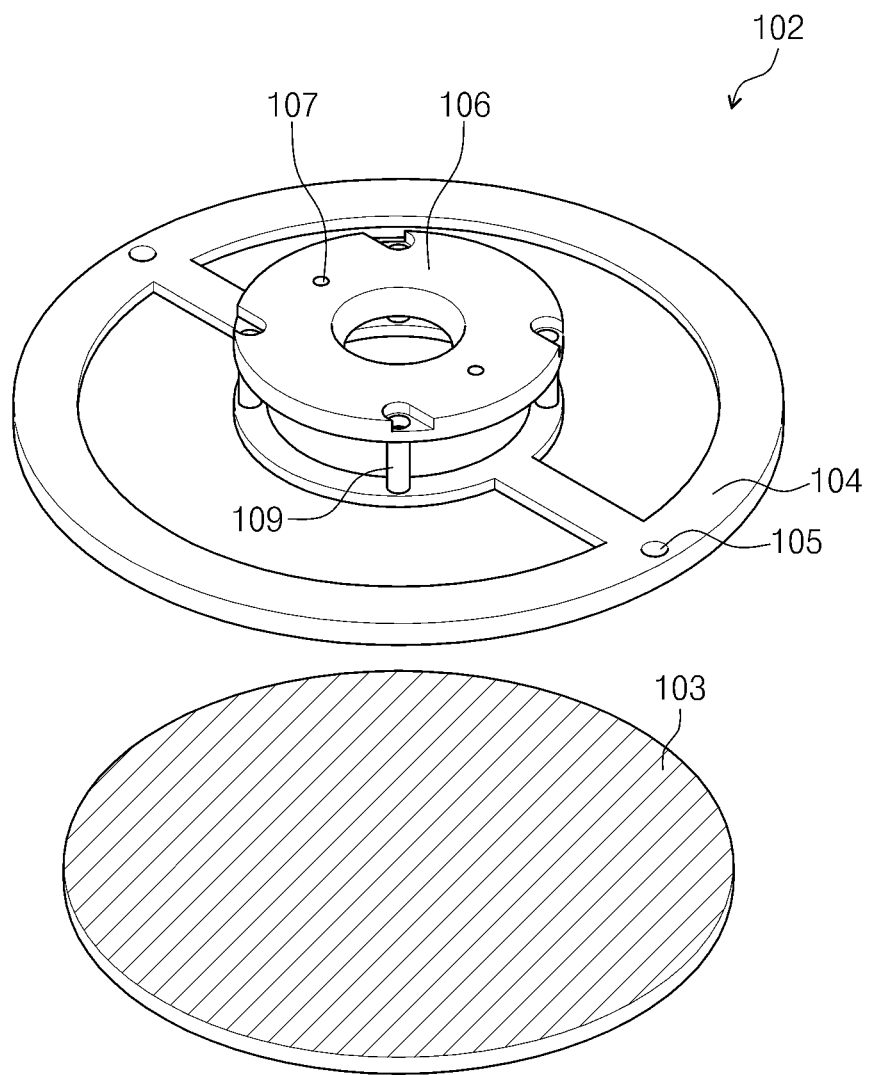
FIG. 8 is a diagram schematically illustrating a probe card of FIG. 7.

FIG. 8 is a diagram schematically illustrating a probe card 102.

Referring to FIG. 8, a probe card 102 includes a main card board 103, a card case 104, and a handle 106. The main card board 103 may be provided on a substrate (not shown). The main card board 103 may include a printed circuit board. The main card board 103 may have a plurality of probe pins (not shown). The main card board 103 is used for an EDS (Electrical Die Sorting) test. In detail, the main card board 103 may be used for a WAT (Wafer Acceptance Test) process. The card case 104 and the handle 106 are fixed to the main card board 103. The card case 104 and the handle 106 may be a package jig. The card case 104 surrounds an edge of the main card board 103. The card case 104 has card alignment holes 105. The card alignment holes 105 are formed at an edge of the card case 104. The handle 106 is on the main card board 103. The handle 106 has handle alignment holes 107. The card alignment holes 105 and the handle alignment holes 107 are aligned in the same direction. The handle 106 and the card case 104 are joined by a plurality of space bolts 109. The space bolts 109 separate the handle 106 and the card case 104.

Figure 9:
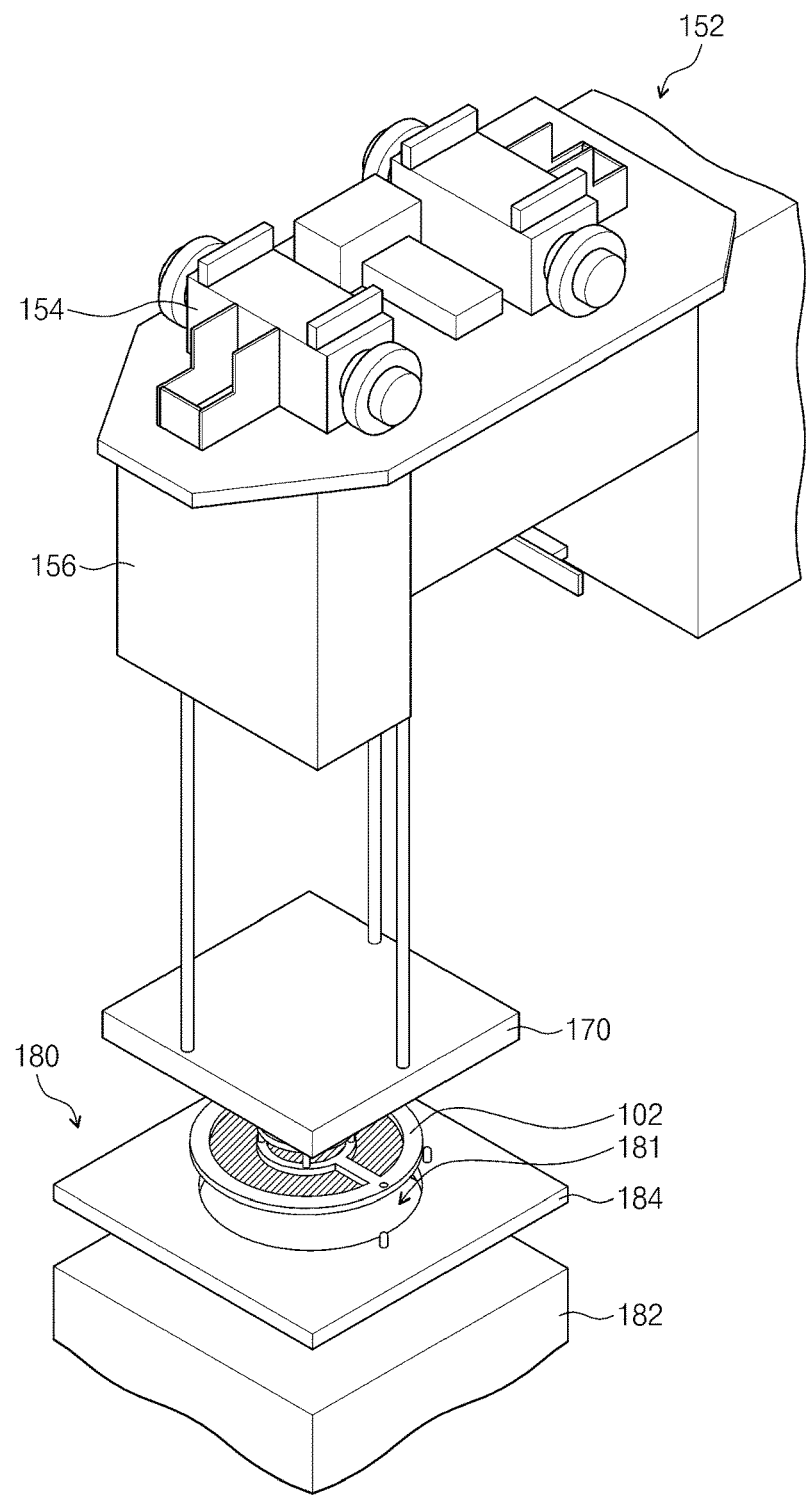
FIG. 9 is a perspective view of a card loading apparatus of FIG. 1.
Figure 10:
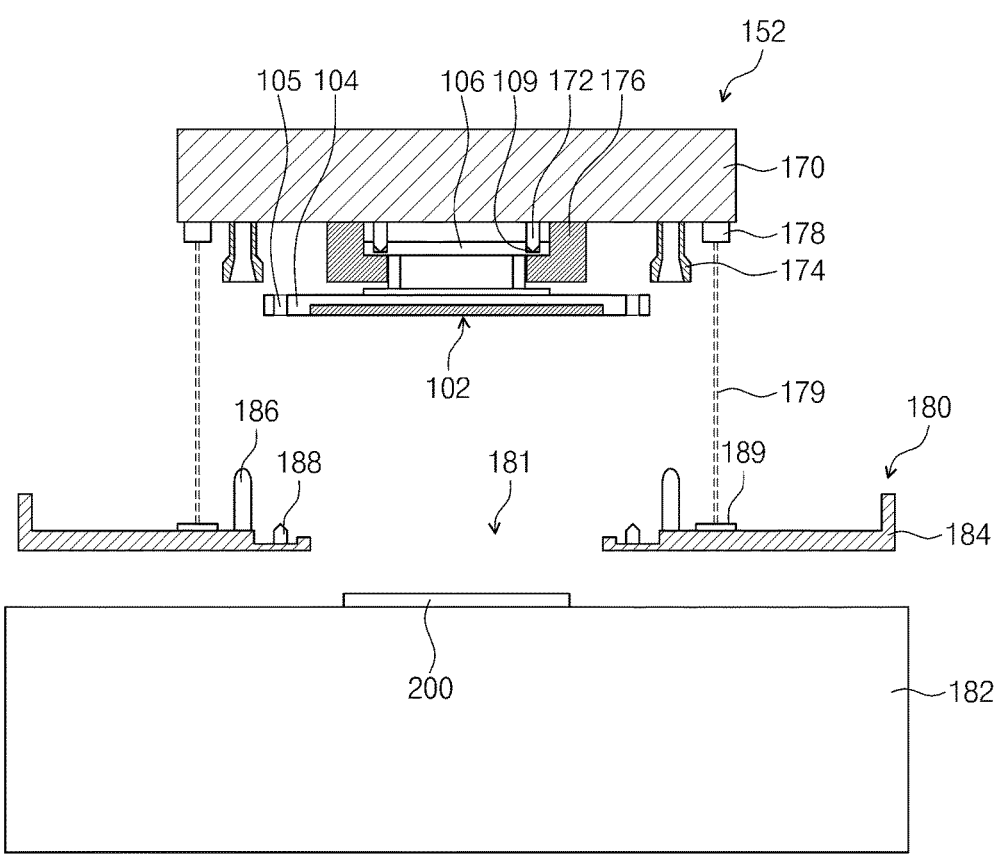
FIG. 10 is a cross-sectional view of a second hand portion and a stage unit of FIG. 9.

FIG. 9 is a perspective view of a card loading apparatus 150. FIG. 10 is a cross-sectional view of a second hand portion 170 and a stage unit 180 of FIG. 9.

Referring to FIGS. 9 and 10, a card loading apparatus 150 includes a card transfer unit 152 and a stage unit 180.

The card transfer unit 152 is on the stage unit 180. The card transfer unit 152 transfers a probe card 102 on the stage unit 180. The card transfer unit 152 may be an overhead hoist transfer. The card transfer unit 152 includes a second driving portion 154, a second hoisting portion 156, and a second hand portion 170.

The second driving portion 154 moves the second hoisting portion 156 and the second hand portion 170. The second hoisting portion 156 lifts the second hand portion 170 onto the stage unit 180. The second hand portion 170 holds the probe card 102. The second hand portion 170 puts the probe card 102 on the stage unit 180 safely. In some example embodiments, the second hand portion 170 includes handle alignment pins 172, hand alignment sockets 174, clamps 176, and location sensors 178.

The handle alignment pins 172 align the handle 106 with respect to the second hand portion 170. The handle alignment pins 172 may be between the clamps 176. The handle alignment pins 172 may be shorter in length than the clamps 176 and the hand alignment sockets 174.

The hand alignment sockets 174 align the second hand portion 170 with respect to the stage unit 180. The hand alignment sockets 174 may be between the location sensors 178. The hand alignment sockets 174 may be between the location sensors 178 and the clamps 176. The hand alignment sockets 174 may be longer in length than the handle alignment pins 172 and the clamps 176.

The clamps 176 grasp the handle 106. The clamps 176 may be between the hand alignment sockets 174. The clamps 176 may be between the hand alignment sockets 174 and the handle alignment pins 172.

The location sensors 178 detect a location of the second hand portion 170 with respect to the stage unit 180. The location sensors 178 may be at an outside of the hand alignment sockets 174.

The stage unit 180 transfers the probe card 102 onto a substrate 200. In some example embodiments, the stage unit 180 includes a stage 182 and a load port 184.

The stage 182 supports the substrate 200. The stage 182 may be under the load port 184.

The load port 184 is between the stage 182 and the second hand portion 170. The second hand portion 170 provides the probe card 102 on the load port 184. The load port 184 is on the stage 182. In contrast, after the probe card 102 is loaded on the load port 184 from the second hand portion 170, the load port 184 shifts the probe card 102 onto the stage 182. In some example embodiments, the load port 184 has a port hole 181, hand alignment pins 186, card alignment pins 188, and reflection plates 189.

The port hole 181 is at the center of the load port 184. The port hole 181 allows the substrate 200 on the stage 182 to be exposed to the probe card 102. At a wafer acceptance test, the probe card 102 is electrically connected with the substrate 200.

The hand alignment pins 186 may be in a direction of the second hand portion 170. The hand alignment pins 186 may be connected with the hand alignment sockets 174. The hand alignment pins 186 and the hand alignment sockets 174 align the load port 184 and the second hand portion 170. The hand alignment pins 186 may be longer in length than the card alignment pins 188.

The card alignment pins 188 may be between the hand alignment pins 186. The card alignment pins 188 may be in the same direction as the hand alignment pins 186. The card alignment pins 188 are connected with the card alignment holes 105. The card alignment pins 188 and the card alignment holes 105 align the load port 184 and the probe card 102. A first height where the card alignment pins 188 are lower than a second height where the hand alignment pins 186 are positioned.

The hand alignment pins 186 and the hand alignment sockets 174 are connected before the card alignment pins 188 and the card alignment holes 105 are connected.

The reflection plates 189 may be at the outside of the card alignment pins 188. The reflection plates 189 are aligned to the location sensors 178. The location sensors 178 may include manual infrared sensors.

Figure 11:
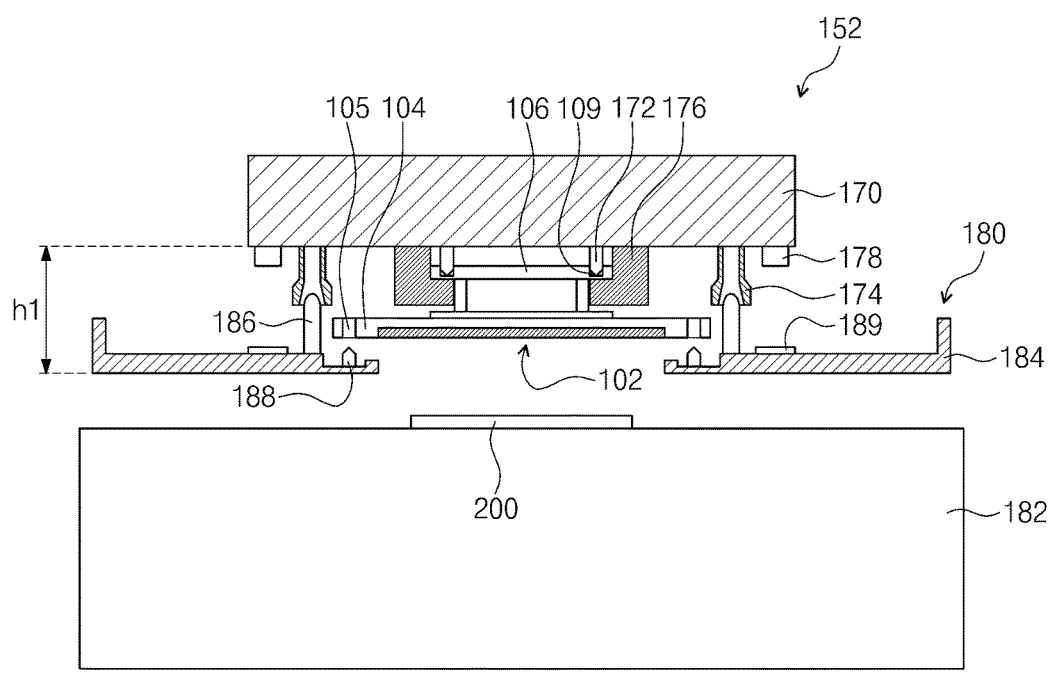
FIGS. 11 to 13 are diagrams schematically illustrating a loading operation of a probe card.
Figure 12:
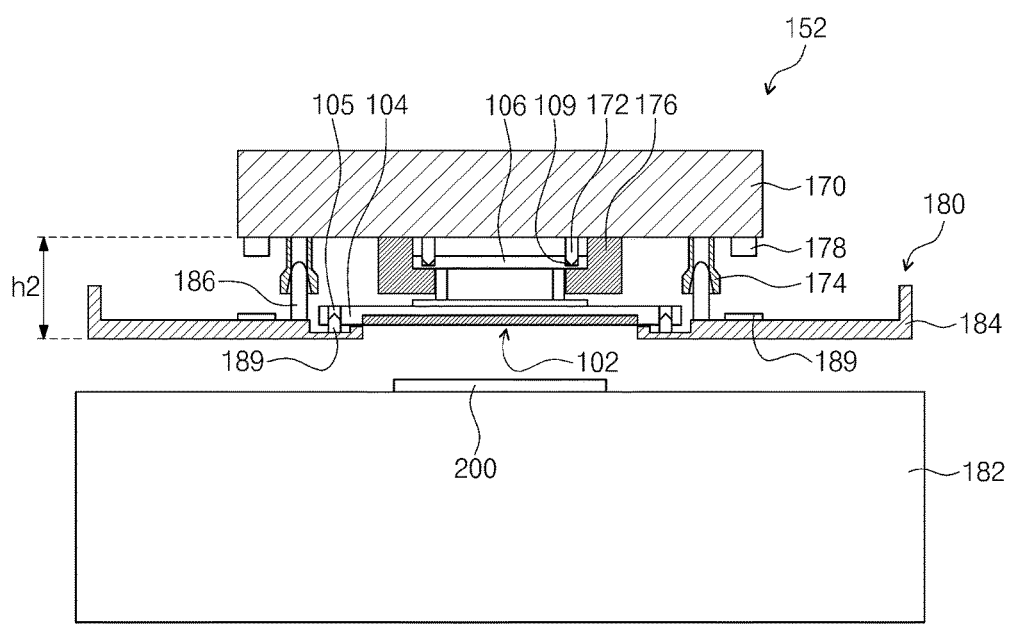
Figure 13:
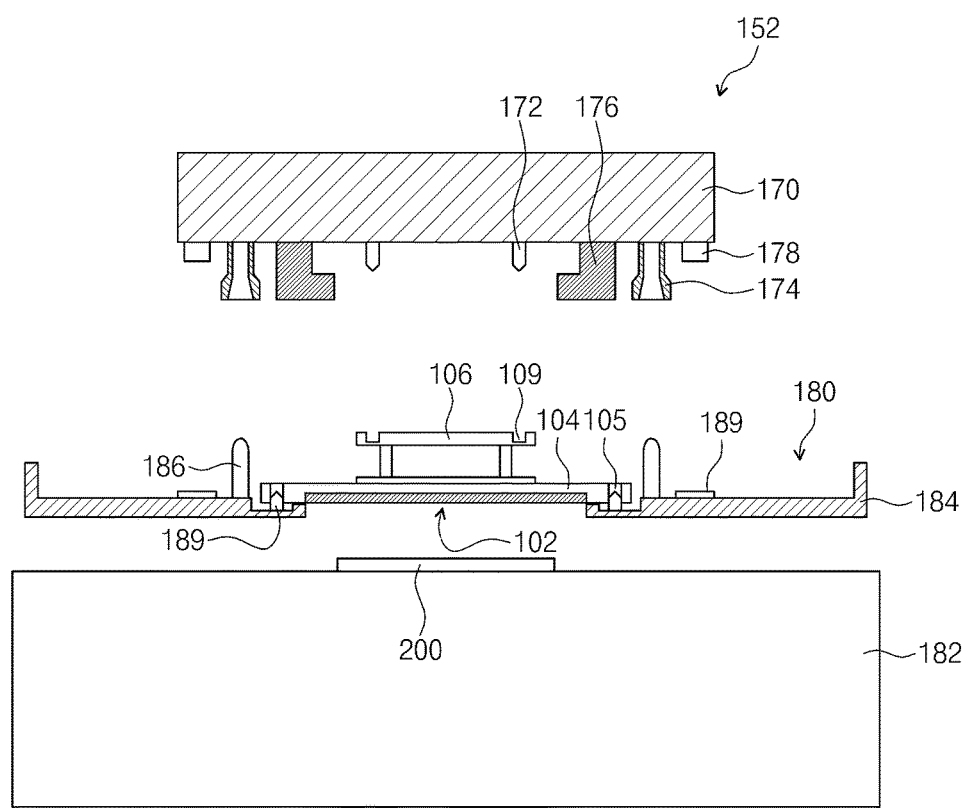

FIGS. 11 to 13 are diagrams schematically illustrating a loading operation of a probe card 102.

Referring to FIGS. 9 and 10, location sensors 178 detect whether the card transfer unit 152 and the stage unit 180 are aligned. For example, if the second hand portion 170 is placed on the stage unit 180, the location sensors 178 provide infrared laser beams 179 to the reflection plates 189. The location sensors 178 sense the infrared laser beams 179 reflected by the reflection plates 189. The card transfer unit 152 aligns the second hand portion 170 to the stage unit 180.

Referring to FIG. 11, if the second hand portion 170 goes down up to a first height h1, hand alignment pins 186 are inserted in hand alignment sockets 174 such that the hand alignment pins 186 and the hand alignment sockets 174 are coupled. The second hand portion 170 and a load port 184 are aligned. The hand alignment sockets 174 and the hand alignment pins 186 prevent and/or reduce misalignment of a probe card 102 and the load port 184. In addition, the hand alignment sockets 174 and the hand alignment pins 186 prevent and/or reduce damage of the probe card 102 due to the misalignment of the probe card 102 and the load port 184.

Referring to FIG. 12, if the second hand portion 170 goes down to a second height h2, card alignment pins 188 are inserted in card alignment holes 105. The second height h2 is smaller than the first height h1. The probe card 102 is loaded on the load port 184.

Referring to FIG. 13, the second hand portion 170 is separated from the probe card 102. Clamps 176 may release a handle 106. A distance between the clamps 176 may become longer.

Figure 14:
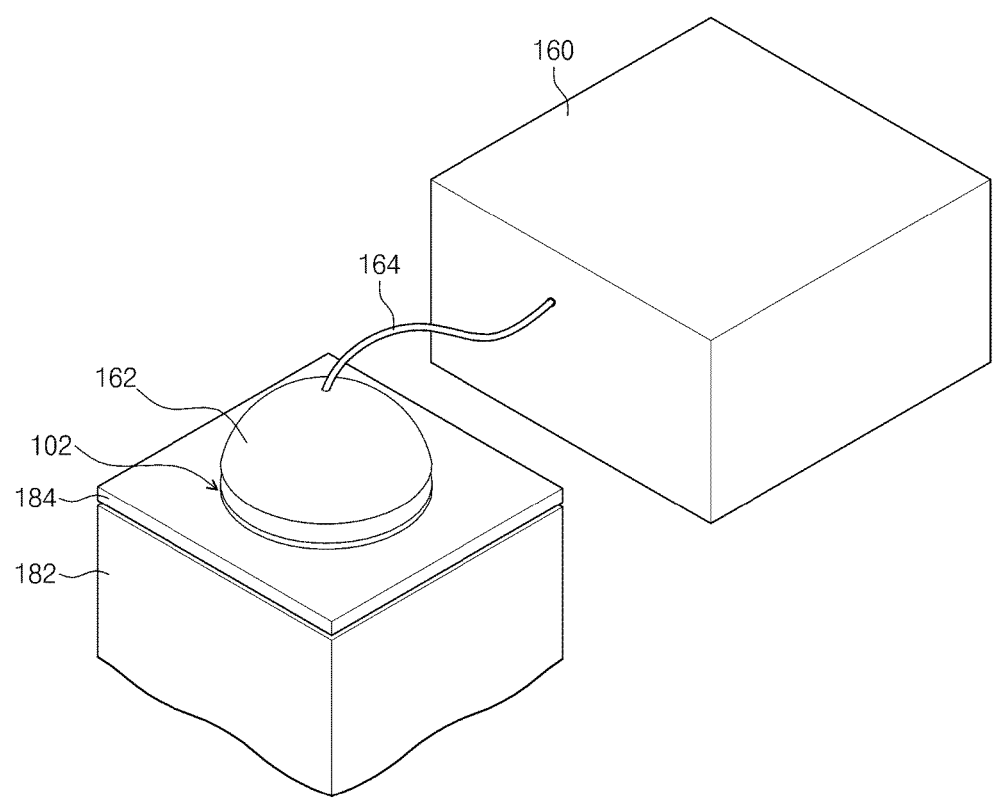

FIG. 14 is a diagram schematically illustrating a test apparatus 160.

Referring to FIGS. 13 and 14, a test apparatus 160 has a card connection portion 162 connected to a probe card 102 and an interconnection 164. The card connection portion 162 is provided on the probe card 102. In some example embodiments, the card connection portion 162 may consist of a single socket or a plurality of sockets. The test apparatus 160 is electrically connected to a substrate 200 via the card connection portion 162, the interconnection 164, and the probe card 102. The test apparatus 160 performs WAT or DC testing on the substrate 200. A load port 184 and a stage 182 become closer whenever the substrate 200 is tested. That is, the stage 182 goes up to the load port 184, or the load port 184 goes down to the stage 182.

Meanwhile, if the life of the probe card 102 ends, then the probe card 102 is replaced. In contrast, the probe card 102 may be replaced when a substrate type is changed. An unloading operation of the probe card 102 may be performed almost the same as a loading method.

FIGS. 15 to 18 are diagrams for describing an unloading operation of a probe card 102.

Figure 15:
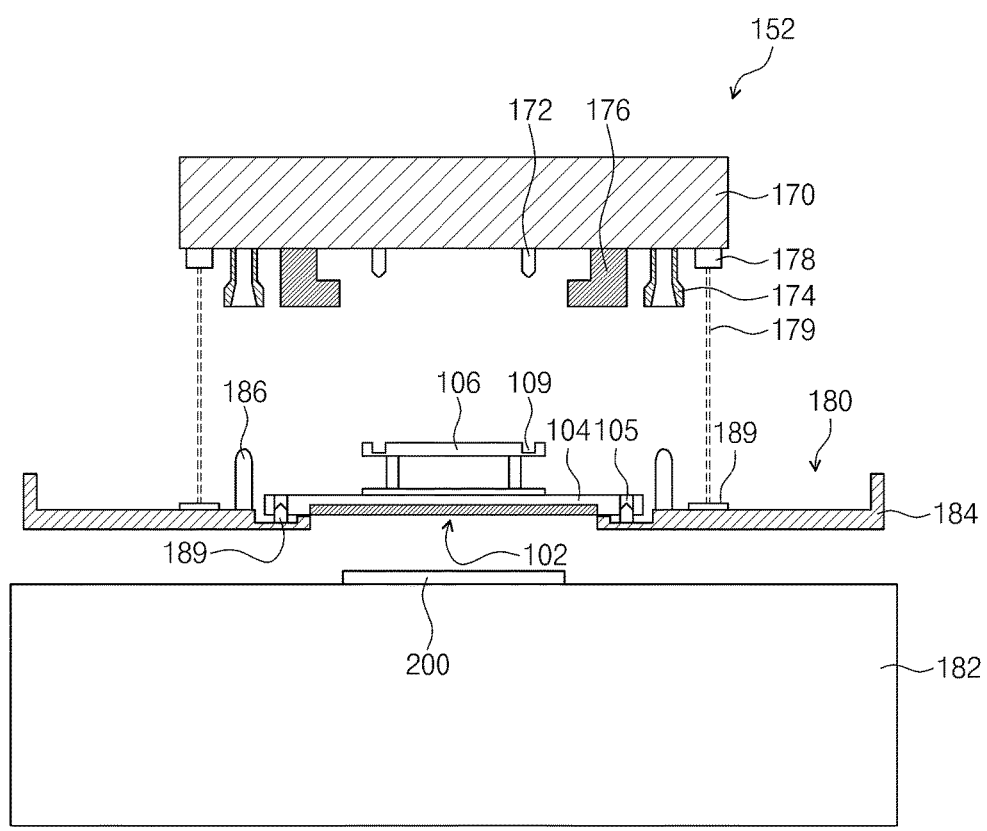
FIGS. 15 to 18 are diagrams for describing an unloading operation of a probe card.

Referring to FIG. 15, location sensors 178 detect whether the card transfer unit 152 and the stage unit 180 may be aligned. Clamps 176 may be substantially maximally spaced from each other.

Figure 16:
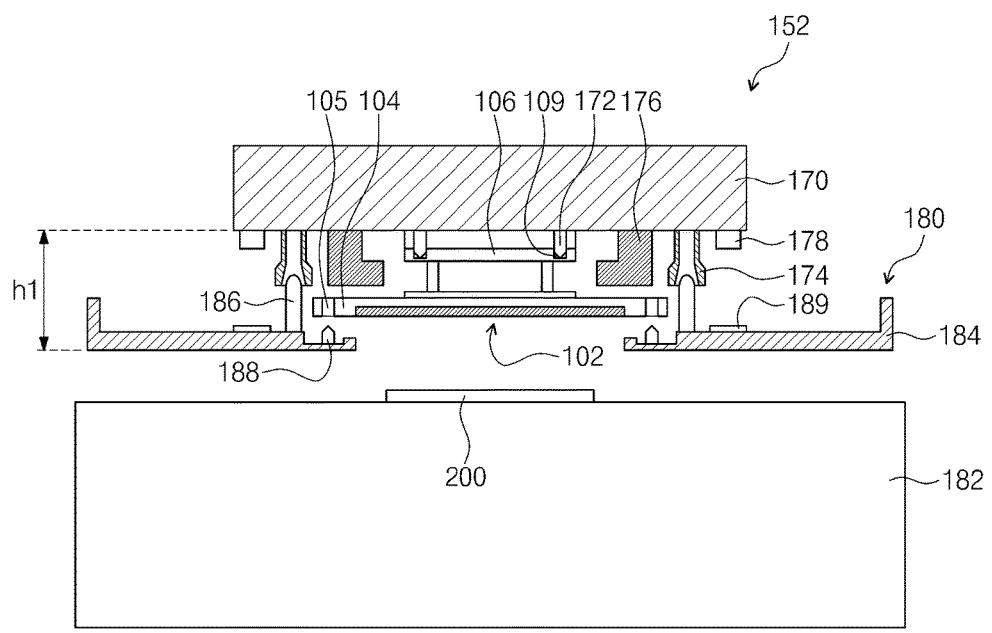

Referring to FIG. 16, if a second hand portion 170 goes down to the first height h1, the hand alignment sockets 174 and the hand alignment pins 186 are connected. A load port 184 and the second hand portion 170 may be aligned.

Figure 17:
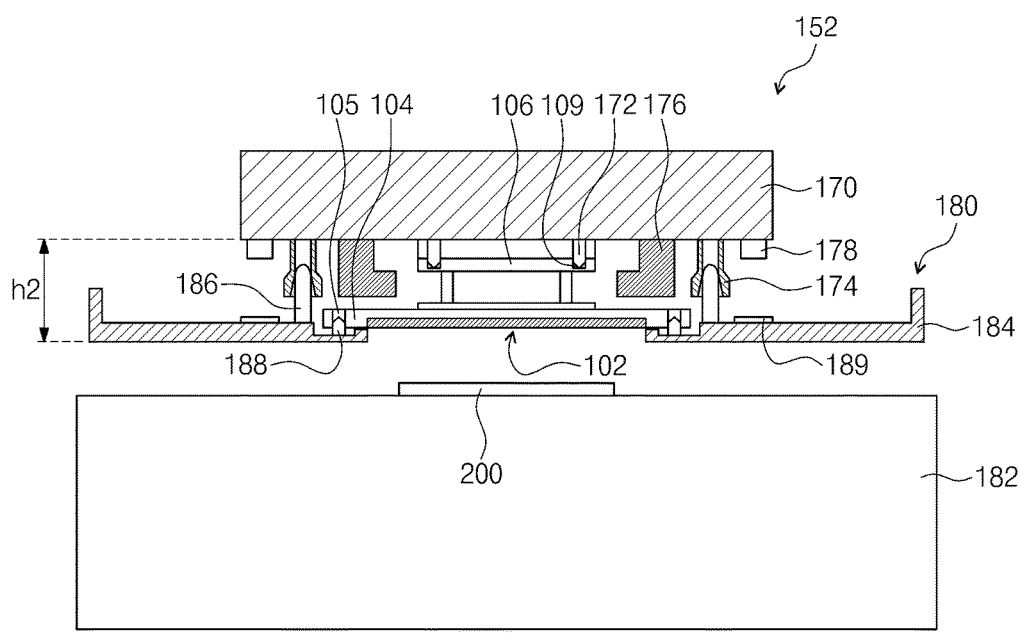

Referring to FIG. 17, when the second hand portion 170 goes down to the second height h2, the handle alignment pins 172 are inserted in the handle alignment holes 107. The hand portion 170 is aligned to the probe card 102.

Referring to FIG. 12, the clamps 176 grasp a handle 106 as a distance between the clamps 176 becomes closer. The second hand portion 170 and a probe card 102 are fixed to the second hand portion 170.

Figure 18:
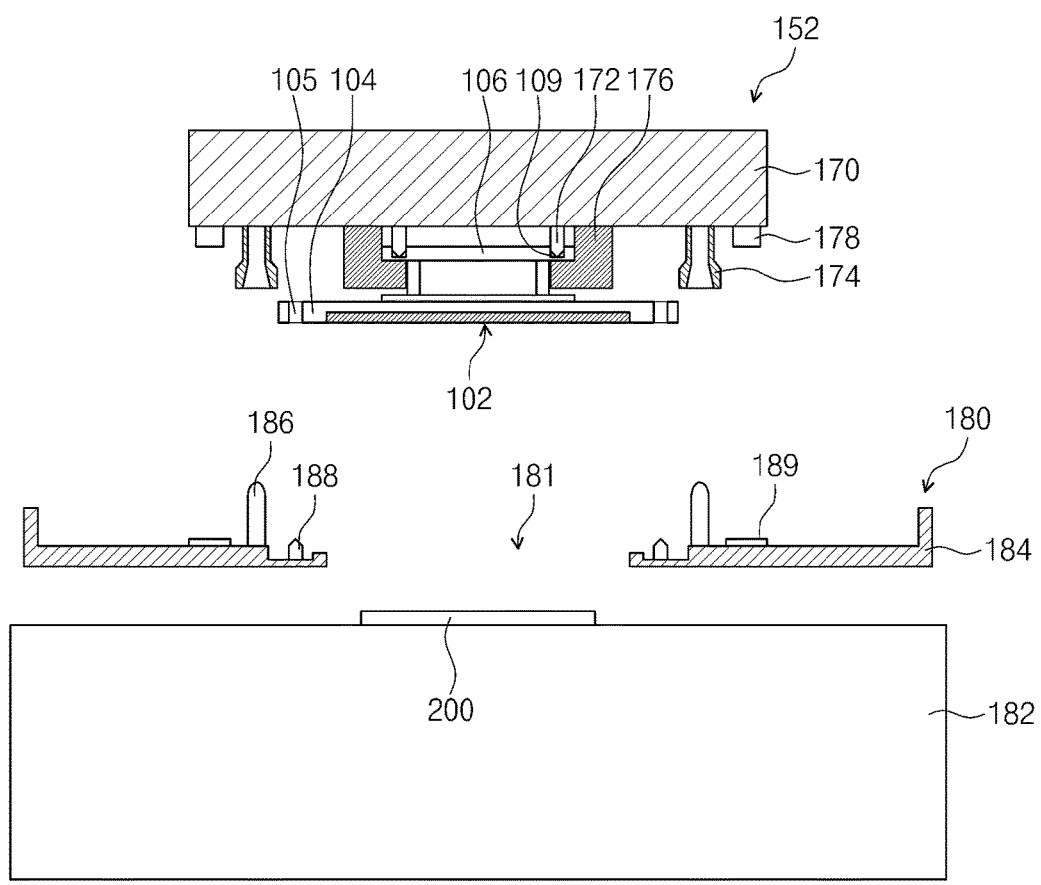

Referring to FIG. 18, the probe card 102 is unloaded from a load port 184 as the second hand portion 170 rises.

As described above, a probe managing system is capable of automatizing logistics movement of a probe card. The probe managing system may include a manual carrier transfer apparatus, a jeep tower, an automatic carrier transfer apparatus, a stocker, a probe card loading apparatus, and a test apparatus. The probe card loading apparatus may include a load port and a substrate transfer unit. The substrate transfer unit is aligned to the load port. A probe card in the substrate transfer unit is aligned to the load port.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A loading apparatus comprising:
a package jig configured to fix to a package, the package jig including,
 a case configured to surround an edge of the package and having first alignment holes adjacent to the edge of the package; and
 a handle configured to connect to the case and positioned on the package;
a transfer unit including a hand for holding the package jig and configured to transfer the package; and
a load port on which the package transferred by the transfer unit is loaded, the load port and the hand comprising,
 first alignment pins and first alignment sockets for aligning the package to the load port.

2. The loading apparatus of claim 1,
wherein the load port further comprises:
 second alignment pins between the first alignment pins and extending into the first alignment holes.

3. The loading apparatus of claim 2, wherein the first alignment pins are longer in length than the second alignment pins.

4. The loading apparatus of claim 2, wherein the first alignment pins and the second alignment pins are aligned in the same direction.

5. The loading apparatus of claim 2, wherein a height where the second alignment pins are positioned is lower than a height where the first alignment pins are positioned.

6. The loading apparatus of claim 2, wherein the hand further comprises:
 clamps between the first alignment sockets and configured to fix the handle.

7. The loading apparatus of claim 6, wherein the handle has second alignment holes, and
 wherein the hand further comprises:

third alignment pins between the clamps and provided in the second alignment holes.

8. The loading apparatus of claim 7, wherein the third alignment pins are shorter in length than the clamps and the first alignment sockets.

9. The loading apparatus of claim 6, wherein the first alignment sockets are longer in length than the clamps.

10. The loading apparatus of claim 1, wherein the load port further comprises reflection plates at the outside of the first alignment pins, and wherein the hand further comprises:
location sensors at the outside of the first alignment sockets and aligned to the reflection plates.

11. A probe card managing system comprising:
a stocker configured to keep a probe card;
a tester configured to test a substrate connected with the probe card; and
a card loading apparatus configured to transfer the probe card to the stocker and to load the probe card on the substrate,
the card loading apparatus comprising:
a probe card jig configured to fix to a probe card, the probe card jig including,
a case configured to surround an edge of the probe card and having first alignment holes adjacent to the edge of the probe card, and
a handle configured to connect to the case and positioned on the probe card;
a transfer unit including a hand configured to hold the probe card jig and configured to transfer the probe card; and
a load port on which the probe card transferred by the transfer unit is loaded,
the load port and the hand comprising:
first alignment pins and first alignment sockets configured to align the probe card to the load port.

12. The probe card managing system of claim 11, further comprising:
a carrier transfer apparatus configured to transfer at least one carrier on which the probe card is loaded, and
wherein the carrier comprises:
a first housing;
at least one first rack in a housing and having a hole opened in an entrance direction of the housing; and
support blocks on the first rack along an edge of the hole and configured to support the probe card.

13. The probe card managing system of claim 12, wherein the load port further comprises guide pins adjacent to the support blocks and provided in the first alignment holes.

14. The probe card managing system of claim 12, wherein the stocker comprises:
a plurality of second racks configured to receive the probe card;
a transfer port configured to transfer the probe card provided on the second racks to the card loading apparatus; and
a carrier opener configured to open the carrier to provide the probe card to the second racks.

15. The probe card managing system of claim 12, wherein the carrier transfer apparatus comprises:
a first carrier transfer apparatus configured to transfer the carrier manually; and
a second carrier transfer apparatus configured to transfer the carrier automatically, and
further comprising:
jeep towers between the first and second carrier transfer apparatuses and configured to elevate the carrier.

* * * * *